(12) United States Patent
Hung et al.

(10) Patent No.: US 12,494,438 B2
(45) Date of Patent: Dec. 9, 2025

(54) ELECTRONIC DEVICE HAVING ALIGNMENT MARK

(71) Applicant: INDUSTRIAL TECHNOLOGY RESEARCH INSTITUTE, Hsinchu (TW)

(72) Inventors: Tsung-Yi Hung, Zhubei (TW); Yu-Wei Huang, Chiayi (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 688 days.

(21) Appl. No.: 17/886,333

(22) Filed: Aug. 11, 2022

(65) Prior Publication Data
US 2023/0187372 A1 Jun. 15, 2023

(30) Foreign Application Priority Data
Dec. 10, 2021 (TW) .................................. 110146339

(51) Int. Cl.
*H01L 23/544* (2006.01)
*H01L 23/00* (2006.01)
*H01L 23/538* (2006.01)

(52) U.S. Cl.
CPC ........ *H01L 23/544* (2013.01); *H01L 23/5389* (2013.01); *H01L 24/05* (2013.01);
(Continued)

(58) Field of Classification Search
CPC ... H01L 23/544; H01L 23/5389; H01L 24/05; H01L 24/06; H01L 24/20
See application file for complete search history.

(56) References Cited

U.S. PATENT DOCUMENTS

| 6,787,892 B2 | 9/2004 | Furuya |
| 8,928,159 B2 | 1/2015 | Chang |

(Continued)

FOREIGN PATENT DOCUMENTS

| CN | 111341761 A | 6/2020 |
| TW | 202013704 A | 4/2020 |

(Continued)

*Primary Examiner* — Jeff W Natalini
*Assistant Examiner* — Rose Keagy
(74) *Attorney, Agent, or Firm* — Maschoff Brennan

(57) ABSTRACT

An electronic device includes a via-array substrate, an outer layer, and an alignment substrate. The via-array substrate has a plurality of first vias. The outer layer has a plurality of second vias and is disposed on a side of the via-array substrate. The first vias are greater in distribution density or quantity than the second vias. A part of the first vias is electrically connected to the second vias, and another part of the first vias is electrically floating. The alignment substrate includes a core layer disposed on the outer layer, a plurality of conductive traces, a plurality of interconnecting pads, and a plurality of alignment mark pads. The conductive traces are disposed in the core layer. The interconnecting pads and the alignment mark pads are disposed on a surface of the core layer located away from the outer layer. A part of the conductive traces electrically connects a part of the interconnecting pads and a part of the first vias. A pattern of each of the alignment mark pads is different from a pattern of each of the interconnecting pads.

20 Claims, 15 Drawing Sheets

(52) U.S. Cl.
CPC .............. *H01L 24/06* (2013.01); *H01L 24/20* (2013.01); *H01L 24/14* (2013.01); *H01L 24/16* (2013.01); *H01L 2223/54426* (2013.01); *H01L 2224/05555* (2013.01); *H01L 2224/0613* (2013.01); *H01L 2224/1413* (2013.01); *H01L 2224/16227* (2013.01); *H01L 2224/2105* (2013.01); *H01L 2224/2205* (2013.01)

(56) References Cited

U.S. PATENT DOCUMENTS

| | | | |
|---|---|---|---|
| 9,842,784 | B2 | 12/2017 | Nasrullah |
| 10,734,363 | B2 | 8/2020 | Andrews |
| 2010/0032811 | A1* | 2/2010 | Ding ................... H01L 25/0657 257/E21.597 |
| 2013/0249085 | A1* | 9/2013 | Ide ....................... H01L 25/0657 257/737 |
| 2016/0079208 | A1* | 3/2016 | Heo .................... H01L 25/0657 257/737 |
| 2016/0247790 | A1 | 8/2016 | Huang |
| 2017/0194299 | A1 | 7/2017 | Kwon |
| 2019/0088547 | A1 | 3/2019 | Chiu |
| 2019/0393159 | A1* | 12/2019 | Chen ....................... H01L 24/20 |
| 2021/0255506 | A1* | 8/2021 | Wu ........................ H10K 77/111 |
| 2021/0257279 | A1* | 8/2021 | Hung ...................... H05K 1/114 |
| 2021/0367112 | A1 | 11/2021 | Bergmann |
| 2021/0375830 | A1 | 12/2021 | Elsherbini |
| 2022/0359449 | A1* | 11/2022 | Chen ....................... H01L 24/19 |

FOREIGN PATENT DOCUMENTS

| | | |
|---|---|---|
| TW | 202025318 A | 7/2020 |
| TW | 202143426 A | 11/2021 |

\* cited by examiner

ELECTRONIC DEVICE HAVING ALIGNMENT MARK

CROSS-REFERENCE TO RELATED APPLICATIONS

This non-provisional application claims priority under 35 U.S.C. § 119(a) on patent application No(s). 110146339 filed in R.O.C. Taiwan on Dec. 10, 2021, the entire contents of which are hereby incorporated by reference.

TECHNICAL FIELD

The disclosure relates to an electronic device having alignment marks.

BACKGROUND

Conventionally, an external electrical component is mounted on a substrate having vias, and the external electrical component can be operated by giving the vias a predetermined potential. The quantity and arrangement of the vias on the substrate were determined by considering the configuration of the external electrical component.

Therefore, the arrangement of vias on a typical substrate has to be customized for the external electrical component. This results in extra time and cost on developing and manufacturing substrates with various arrangements of vias customized for different configurations of external electrical components.

SUMMARY

One embodiment of the disclosure provides an electronic device having alignment marks including a via-array substrate, an outer layer, and an alignment substrate. The via-array substrate has a plurality of first vias. The outer layer has a plurality of second vias. The outer layer is disposed on a side of the via-array substrate. The first vias are greater in distribution density or quantity than the second vias, so that a part of the first vias is electrically connected to the second vias, and another part of the first vias is electrically floating. The alignment substrate includes a core layer, a plurality of conductive traces, a plurality of interconnecting pads, and a plurality of alignment mark pads. The core layer has a first surface and a second surface. The core layer is disposed on the outer layer. The first surface faces the outer layer. The conductive traces are disposed in the core layer. The interconnecting pads are disposed on the second surface of the core layer. A part of the conductive traces electrically connects a part of a part of the interconnecting pads and a part of the first vias. The alignment mark pads are disposed on the second surface of the core layer. A pattern of each of the alignment mark pads is different from a pattern of each of the interconnecting pads.

Another embodiment of the disclosure provides an electronic device having alignment marks including a via-array substrate, an outer layer, and an alignment substrate. The via-array substrate has a plurality of first vias. The outer layer has a plurality of second vias. The outer layer is disposed on a side of the via-array substrate. The first vias are greater in distribution density or quantity than the second vias, so that a part of the first vias is electrically connected to the second vias, and another part of the first vias is electrically floating. The alignment substrate includes a core layer, a plurality of conductive traces, a plurality of interconnecting pads, a plurality of alignment mark pads, and a passivation layer. The core layer has a first surface and a second surface. The core layer is disposed on the outer layer. The first surface faces the outer layer. The conductive traces are disposed in the core layer. The interconnecting pads are disposed on the second surface of the core layer. A part of the conductive traces electrically connects a part of the interconnecting pads and a part of the first vias. The alignment mark pads are disposed on the second surface of the core layer. The passivation layer covers the core layer and has a plurality of first openings and a plurality of second openings. The passivation layer is opaque. The interconnecting pads are respectively partially exposed by the first openings. The alignment mark pads are respectively partially exposed by the plurality of second openings. A pattern of each of the first openings has a different size or shape from a pattern of each of the second openings.

The above description about the content of the disclosure and the following description about the embodiments are used to demonstrate and explain the spirit and principle of the disclosure and provide a further explanation of the scope of claims of the disclosure.

BRIEF DESCRIPTION OF THE DRAWINGS

The disclosure will become better understood from the detailed description given hereinbelow and the accompanying drawings which are given by way of illustration only and thus are not intending to limit the disclosure and wherein.

DETAILED DESCRIPTION

Figure 1:
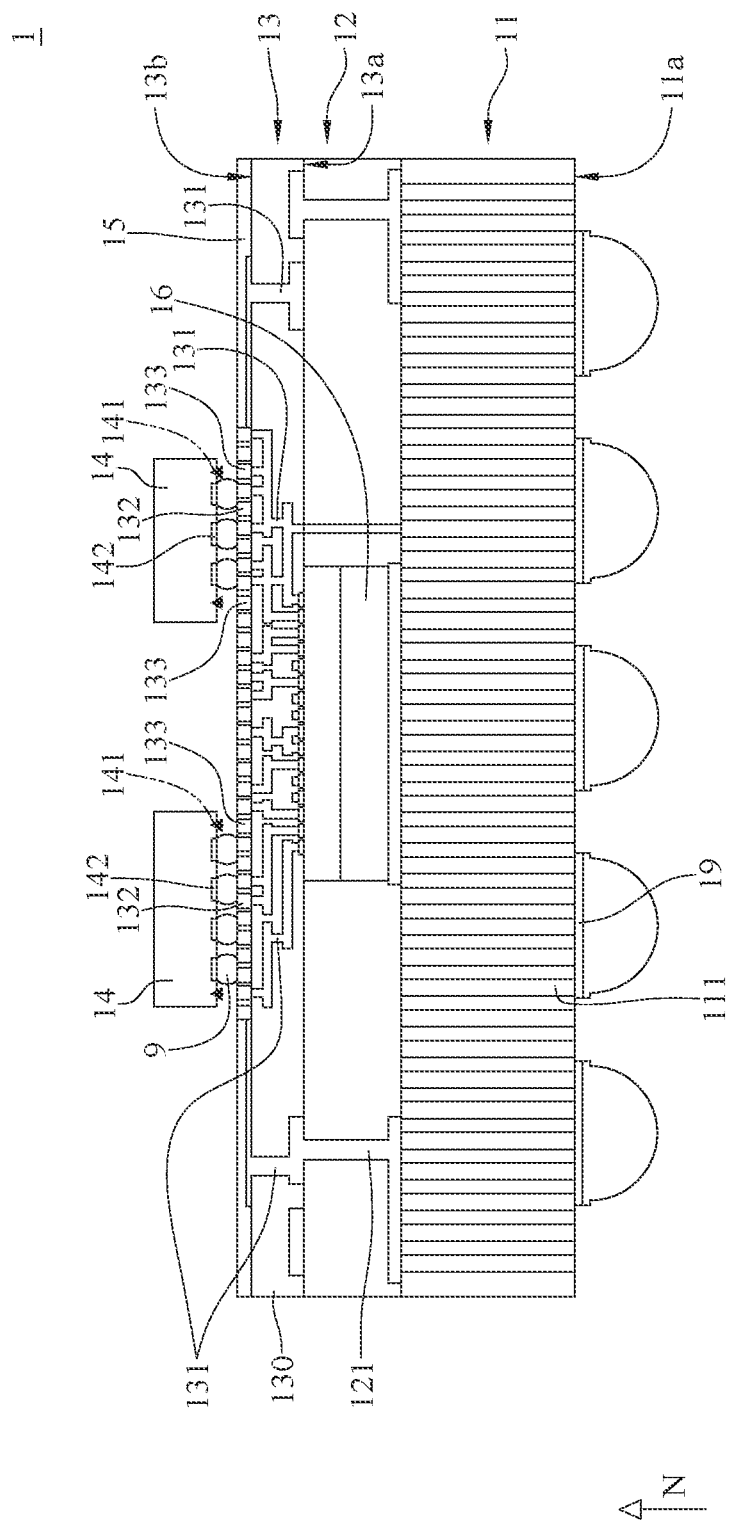
FIG. 1 illustrates a schematic cross-sectional view of an electronic device having alignment marks according to one embodiment of the disclosure.

Features and advantages of embodiments of the disclosure are described in the following detailed description, it allows the person skilled in the art to understand the technical contents of the embodiments of the disclosure and implement them, and the person skilled in the art can easily comprehend the purposes of the advantages of the disclosure.

The following embodiments are further illustrating the perspective of the disclosure, but not intending to limit the disclosure.

The drawings may not be drawn to actual size or scale, some exaggerations may be necessary in order to emphasize basic structural relationships, while some are simplified for clarity of understanding, and the disclosure is not limited thereto. It is allowed to have various adjustments under the spirit of the disclosure. In addition, the spatially relative terms, such as "up", "top", "above", "down", "low", "left", "right", "front", "rear", and "back" and the like, may be used herein for ease of description to describe the relationship of one element or feature to another element(s) of feature(s) as illustrated in the drawings. It will be understood that the spatially relative terms are intended to encompass orientations of the element or feature but not intended to limit the disclosure.

Figure 2:
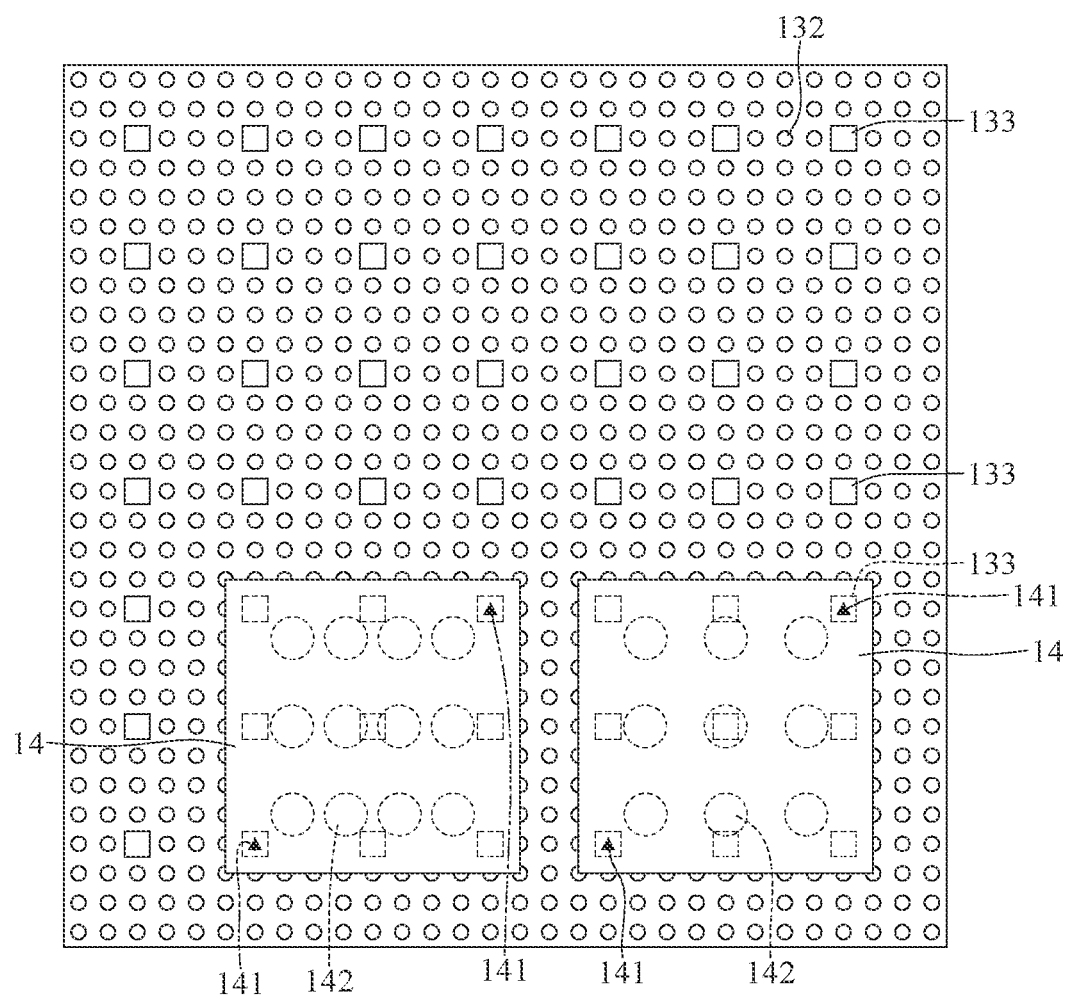
FIG. 2 illustrates a schematic top view of the electronic device in FIG. 1.
Figure 3:
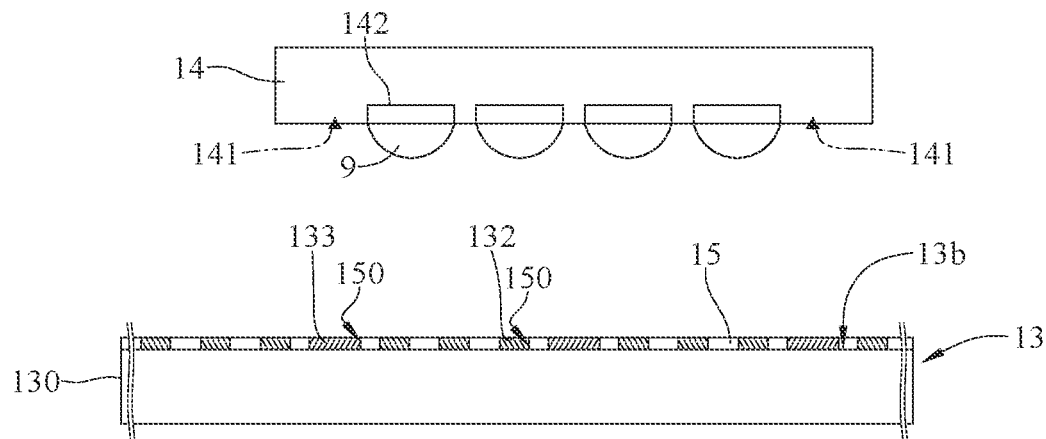
FIG. 3 illustrates a partial schematic cross-sectional view of the electronic device in FIG. 1.

Please refer to FIG. 1, FIG. 2 and FIG. 3. FIG. 1 illustrates a schematic cross-sectional view of an electronic device having alignment marks according to one embodiment of the disclosure. FIG. 2 illustrates a schematic top view of the electronic device in FIG. 1. FIG. 3 illustrates a partial schematic cross-sectional view of the electronic device in FIG. 1.

As shown in FIG. 1, in the embodiment, the electronic device 1 having alignment marks includes a via-array substrate 11, an outer layer 12, an alignment substrate 13, two electronic elements 14, a switchable circuit chip 16, a plurality of external contacts 19, and a plurality of solders 9.

The via-array substrate 11 has a plurality of first vias 111. The switchable circuit chip 16 is disposed on the via-array substrate 11 and electrically connected to the first vias 111.

The outer layer 12 is disposed on a side of the via-array substrate 11 and surrounds the switchable circuit chip 16. The outer layer 12 has a plurality of second vias 121. The first vias 111 are greater in distribution density or quantity than the second vias 121, so that a part of the first vias 111 is electrically connected to the second vias 121, and another part of the first vias 111 is electrically floating.

The alignment substrate 13 includes a core layer 130, a plurality of conductive traces 131, a plurality of interconnecting pads 132, a plurality of alignment mark pads 133, and a passivation layer 15. The core layer 130 has a first surface 13a and a second surface 13b. The core layer 130 is disposed on the outer layer 12. The first surface 13a faces the outer layer 12. The conductive traces 131 are disposed in the core layer 130. The interconnecting pads 132 are disposed on the second surface 13b of the core layer 130. A part of the conductive traces 131 is electrically connected to the alignment mark pads 133. A part of the conductive traces 131 is electrically connected to a part of the second vias 121. In other words, a part of the interconnecting pads 132 is electrically connected to a part of the first vias 111 through a part of the conductive traces 131 and a part of the second vias 121. A part of the conductive traces 131 is electrically connected to the switchable circuit chip 16. The switchable circuit chip 16 is configured for controlling an electrical connection between a part of the interconnecting pads 132 and the first vias 111. The alignment mark pads 133 are disposed on the second surface 13b of the core layer 130. The alignment mark pads 133 do not overlap with the interconnecting pads 132 along a normal line N of the second surface 13b.

As shown in FIG. 2, a pattern of each of the alignment mark pads 133 is different from a pattern of each of the interconnecting pads 132. In particular, the pattern of each of the alignment mark pads 133 and the pattern of each of the interconnecting pads 132 may be different in size, shape, or color. For example, in one embodiment, the pattern of each of the alignment mark pads 133 is in a square shape, and the pattern of each of the interconnecting pads 132 is in a circular shape. The interconnecting pads 132 are greater in distribution density than the alignment mark pads 133. The alignment mark pads 133 are arranged in a square array. The interconnecting pads 132 are arranged in a square array at positions excluding the alignment mark pads 133.

As shown in FIG. 1 and FIG. 3, the alignment mark pads 133 and the interconnecting pads 132 are in direct contact with the second surface 13b. The passivation layer 15 covers the core layer 130 and has a plurality of openings 150. The openings 150 expose the interconnecting pads 132 and the alignment mark pads 133. In FIG. 3, the conductive traces 131 of the alignment substrate 13 are omitted to be shown.

The electronic elements 14 are disposed on the alignment substrate 13. Each of the electronic elements 14 is electrically connected to the first vias 111 through the solders 9, a part of the interconnecting pads 132, a part of the conductive traces 131, and the switchable circuit chip 16. Each of the electronic elements 14 includes a plurality of marks 141 and a plurality of conductive pads 142. The marks 141 are aligned with a part of the alignment mark pads 133. The conductive pads 142 are electrically connected to a part of the interconnecting pads 132. As shown in FIG. 2, the alignment mark pads 133 are greater in quantity than the marks 141 of the electronic elements 14.

As shown in FIG. 1, the external contacts 19 are disposed on a surface 11a of the via-array substrate 11 located away from the alignment substrate 13 and electrically connected to the first vias 111.

In the embodiment, the alignment mark pads 133 and the interconnecting pads 132 may be formed together, so that it is not necessary to additionally form alignment marks in the electronic device 1 by spraying or other means.

Figure 4:
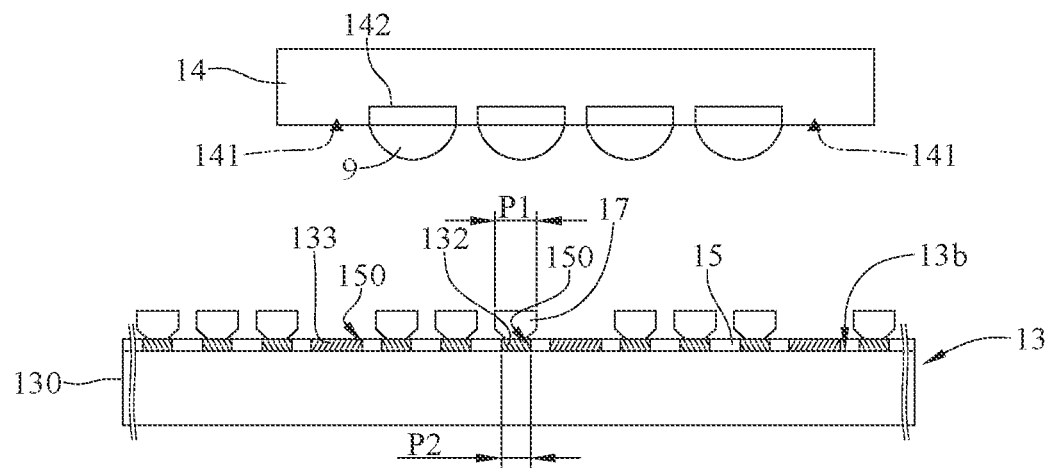
FIG. 4 illustrates a partial schematic cross-sectional view of an electronic device having alignment marks according to another embodiment of the disclosure.

Please refer to FIG. 4. FIG. 4 illustrates a partial schematic cross-sectional view of an electronic device having alignment marks according to another embodiment of the disclosure.

On the basis of the electronic device 1 as illustrated in FIG. 1 and FIG. 3, the electronic device in this embodiment further includes a plurality of interconnecting bumps 17. The interconnecting bumps 17 are respectively disposed on the interconnecting pads 132. An orthogonal projection P1 of each of the interconnecting bumps 17 onto the second surface 13b is larger than an orthogonal projection P2 of each of the interconnecting pads 132 onto the second surface 13b.

Figure 5:
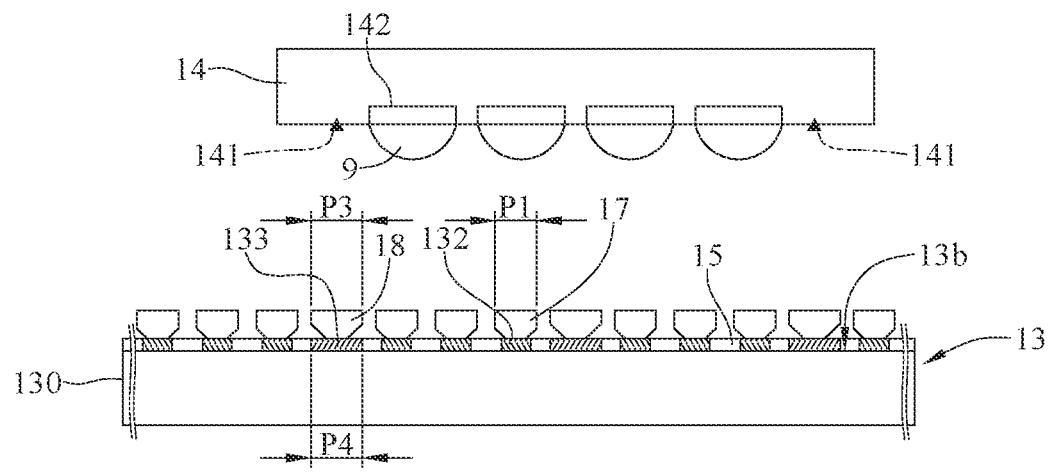
FIG. 5 illustrates a partial schematic cross-sectional view of an electronic device having alignment marks according to another embodiment of the disclosure.

Please refer to FIG. 5. FIG. 5 illustrates a partial schematic cross-sectional view of an electronic device having alignment marks according to another embodiment of the disclosure.

On the basis of the electronic device 1 as illustrated in FIG. 1 and FIG. 3, the electronic device in this embodiment further includes a plurality of interconnecting bumps 17 and a plurality of alignment bumps 18. The interconnecting bumps 17 are respectively disposed on the interconnecting pads 132. The alignment bumps 18 are respectively disposed on the alignment mark pads 133. An orthogonal projection P1 of each of the interconnecting bumps 17 onto the second surface 13b is smaller than an orthogonal projection P3 of each of the alignment bumps 18 onto the second surface 13b. The orthogonal projection P3 of each of the alignment bumps 18 onto the second surface 13b is substantially equal to an orthogonal projection P4 of each of the alignment mark pads 133 onto the second surface 13b.

Figure 6:
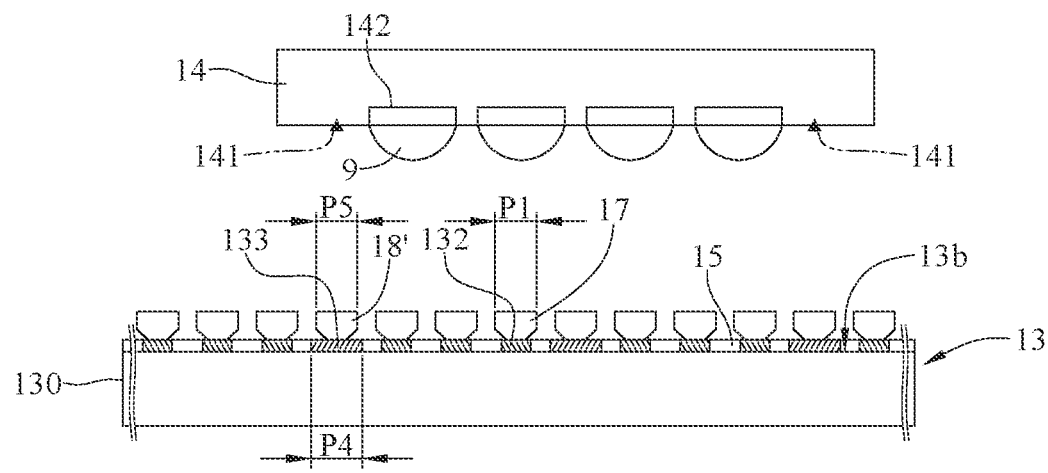
FIG. 6 illustrates a partial schematic cross-sectional view of an electronic device having alignment marks according to another embodiment of the disclosure.

Please refer to FIG. 6. FIG. 6 illustrates a partial schematic cross-sectional view of an electronic device having alignment marks according to another embodiment of the disclosure.

On the basis of the electronic device 1 as illustrated in FIG. 1 and FIG. 3, the electronic device in this embodiment further includes a plurality of interconnecting bumps 17 and a plurality of alignment bumps 18'. The interconnecting bumps 17 are respectively disposed on the interconnecting pads 132. The alignment bumps 18' are respectively disposed on the alignment mark pads 133. An orthogonal projection P1 of each of the interconnecting bumps 17 onto the second surface 13b is substantially equal to an orthogonal projection P5 of each of the alignment bumps 18' onto the second surface 13b. The orthogonal projection P5 of each of the alignment bumps 18' onto the second surface 13b is smaller than an orthogonal projection P4 of each of the alignment mark pads 133 onto the second surface 13b.

Figure 7:
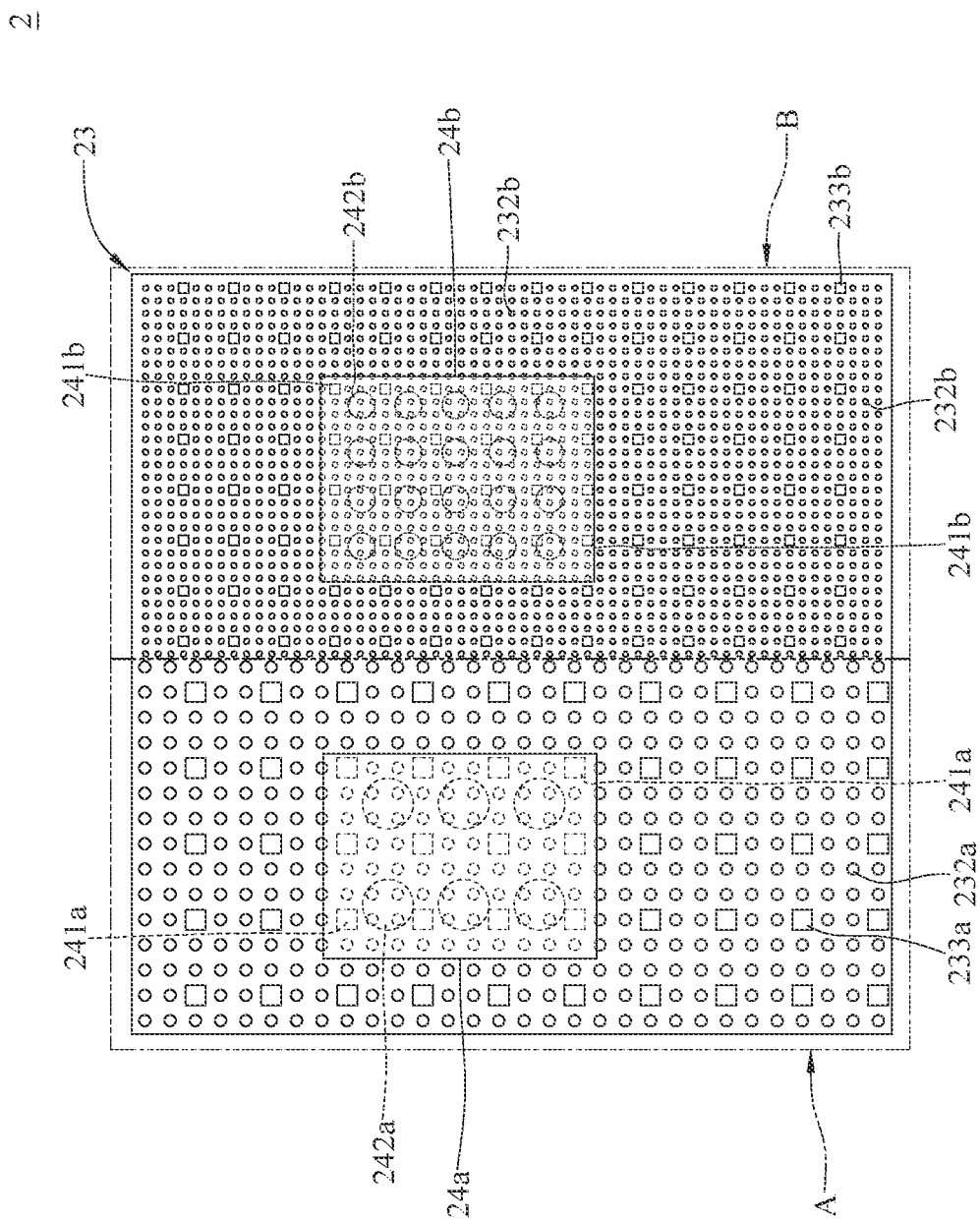
FIG. 7 illustrates a schematic top view of an electronic device having alignment marks according to another embodiment of the disclosure.

Please refer to FIG. 7. FIG. 7 illustrates a schematic top view of an electronic device having alignment marks according to another embodiment of the disclosure.

In the embodiment, the electronic device 2 is similar to the electronic device 1 shown in FIG. 1 and FIG. 2. A difference is that an alignment substrate 23 may be divided into a region A and a region B. A plurality of interconnecting pads 232a in the region A are smaller in distribution density than a plurality of interconnecting pads 232b in the region B. A plurality of alignment mark pads 233a in the region A are smaller in distribution density than a plurality of alignment mark pads 233b in the region B.

In the region A, an electronic element 24a is disposed on the alignment substrate 23. The electronic element 24a includes a plurality of marks 241a and a plurality of conductive pads 242a. The marks 241a are aligned with a part of the alignment mark pads 233a. Each of the conductive pads 242a is electrically connected to a part of the interconnecting pads 232a.

In the region B, an electronic element 24b is disposed on the alignment substrate 23. The electronic element 24b includes a plurality of marks 241b and a plurality of conductive pads 242b. The marks 241b are aligned with a part of the alignment mark pads 233b. Each of the conductive pads 242b is electrically connected to a part of the interconnecting pads 232b.

Figure 8:
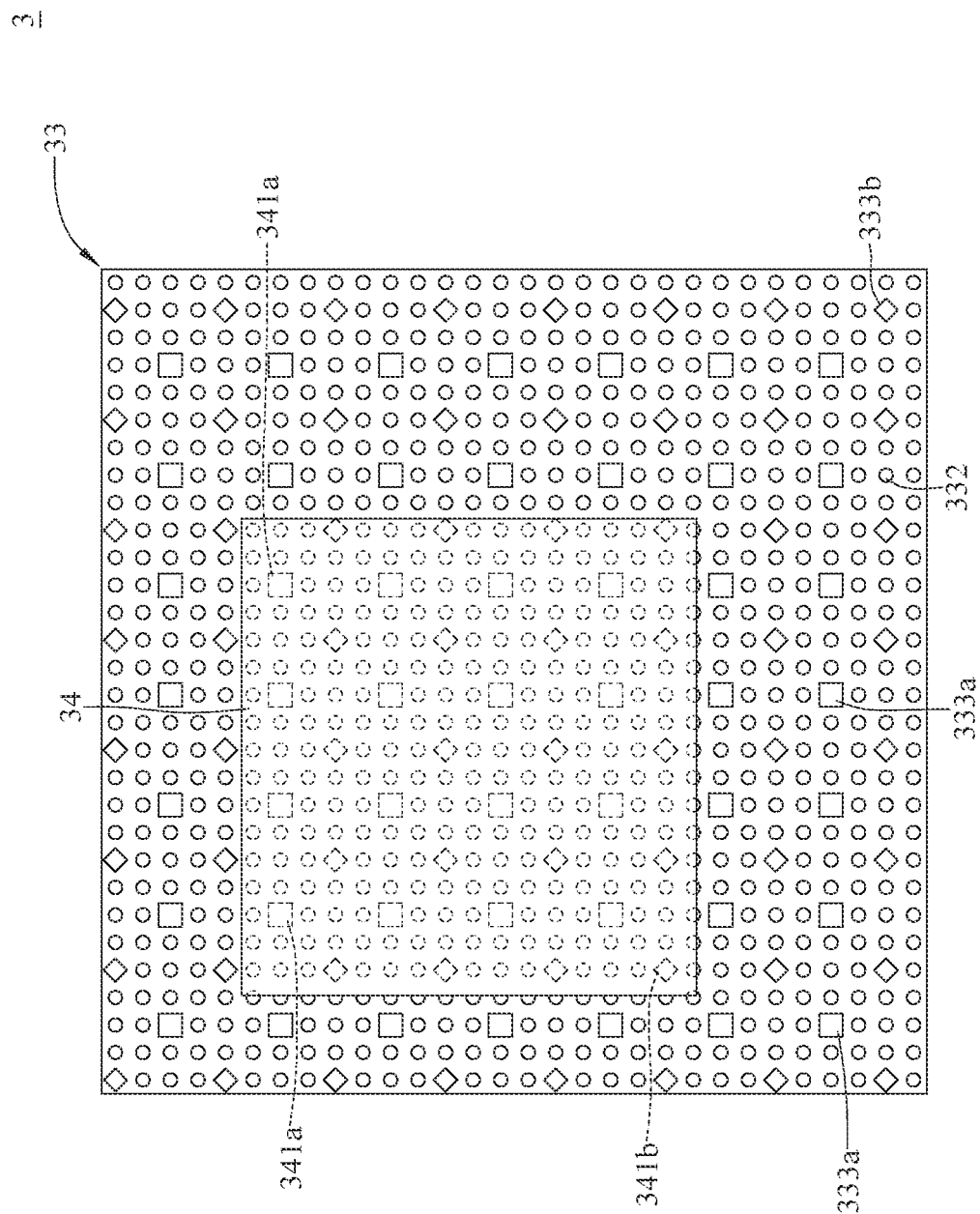
FIG. 8 illustrates a schematic top view of an electronic device having alignment marks according to another embodiment of the disclosure.

Please refer to FIG. 8. FIG. 8 illustrates a schematic top view of an electronic device having alignment marks according to another embodiment of the disclosure.

In the embodiment, the electronic device 3 is similar to the electronic device 1 shown in FIG. 1 and FIG. 2, and a difference lies in an alignment substrate 33 and an electronic element 34. Other details are omitted below.

In the embodiment, the alignment substrate 33 includes a plurality of interconnecting pads 332, a plurality of first alignment mark pads 333a, and a plurality of second alignment mark pads 333b. A pattern of each of the first alignment mark pads 333a is different from a pattern of each of the second alignment mark pads 333b. The pattern of each of the first alignment mark pads 333a is different from a pattern of each of the interconnecting pads 332. The pattern of each of the second alignment mark pads 333b is different from the pattern of each of the interconnecting pads 332. In particular, the pattern of each of the first alignment mark pads 333a is in a square shape, the pattern of each of the second alignment mark pads 333b is in a rhombus shape, and the pattern of each of the interconnecting pads 332 is in a circular shape.

The first alignment mark pads 333a are substantially equal in distribution density to the second alignment mark pads 333b. The interconnecting pads 332 are greater in distribution density than the first alignment mark pads 333a and greater in distribution density than the second alignment mark pads 333b.

The first alignment mark pads 333a are arranged in a square array. The second alignment mark pads 333b are arranged in a square array. The first alignment mark pads 333a and the second alignment mark pads 333b are staggered from each other. There is one column of the second alignment mark pads 333b sandwiched between adjacent two columns of the first alignment mark pads 333a. There is one column of the first alignment mark pads 333a sandwiched between adjacent two columns of the second alignment mark pads 333b. There is one row of the second alignment mark pads 333b sandwiched between adjacent two rows of the first alignment mark pads 333a. There is one row of the first alignment mark pads 333a sandwiched between adjacent two rows of the second alignment mark pads 333b. The interconnecting pads 332 are arranged in a square array at positions excluding the first alignment mark pads 333a and excluding the second alignment mark pads 333b.

The electronic element 34 is disposed on the alignment substrate 33. The electronic element 34 includes two first marks 341a and a second mark 341b. Each of the first marks 341a is aligned with one of the first alignment mark pads 333a. The second mark 341b is aligned with one of the second alignment mark pads 333b.

Figure 9:
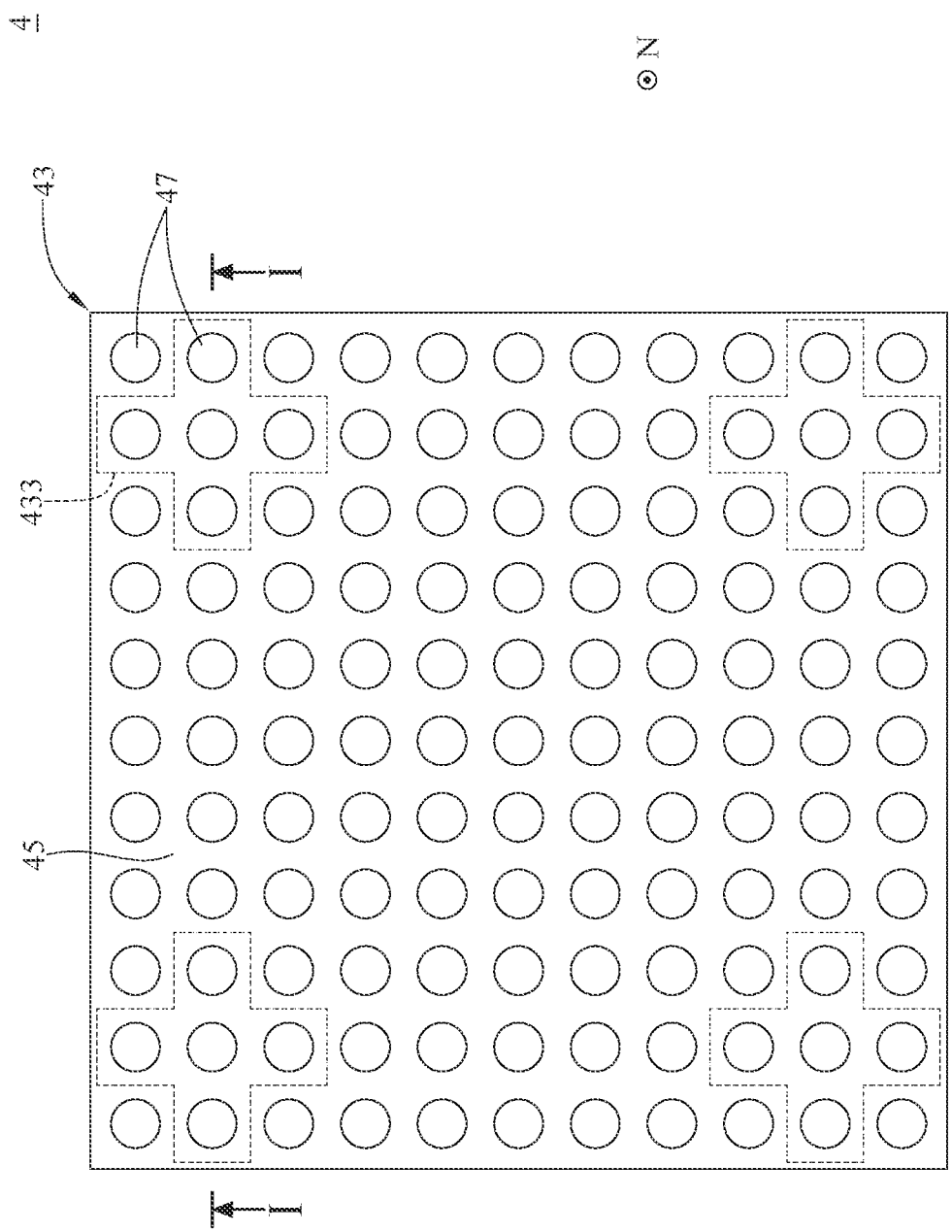
FIG. 9 illustrates a partial schematic top view of an electronic device having alignment marks according to another embodiment of the disclosure.
Figure 10:
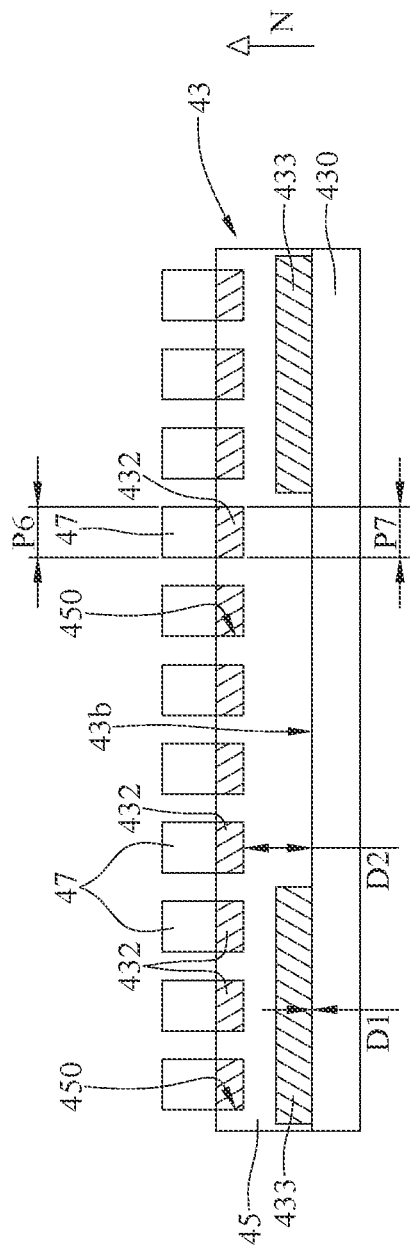
FIG. 10 illustrates a schematic cross-sectional view taken along a line I-I in FIG. 9.

Please refer to FIG. 9 and FIG. 10. FIG. 9 illustrates a partial schematic top view of an electronic device having alignment marks according to another embodiment of the disclosure. FIG. 10 illustrates a schematic cross-sectional view taken along a line I-I in FIG. 9.

In the embodiment, the electronic device 4 is similar to the electronic device 1 shown in FIG. 1 and FIG. 2, and a difference lies in an alignment substrate 43 and a plurality of interconnecting bumps 47. Other details are omitted below.

In the embodiment, the alignment substrate 43 includes a core layer 430, a plurality of interconnecting pads 432, a plurality of alignment mark pads 433, and a passivation layer 45. The passivation layer 45 covers the alignment mark pads 433 and the core layer 430 and has a plurality of openings 450. The openings 450 expose the interconnecting pads 432. A distance D1 from each of the alignment mark pads 433 to the second surface 43b of the core layer 430 is smaller than a distance D2 from each of the interconnecting pads 432 to the second surface 43b. The interconnecting pads 432 and the alignment mark pads 433 are respectively located at different layers.

The interconnecting bumps 47 are respectively disposed on the interconnecting pads 432. An orthogonal projection P6 of each of the interconnecting bumps 47 onto the second surface 43b is substantially equal to an orthogonal projection P7 of each of the interconnecting pads 432 onto the second surface 43b.

The interconnecting pads 432 are greater in distribution density than the alignment mark pads 433. The alignment mark pads 433 are arranged in a square array. The interconnecting pads 432 are also arranged in a square array. One of the alignment mark pads 433 overlaps with five of the interconnecting pads 432 along a normal line N of the second surface 43b. Most of the interconnecting pads 432 do not overlap with the alignment mark pads 433 along the normal line N. A pattern of each of the alignment mark pads 433 is larger in size than a pattern of each of the interconnecting pads 432. The pattern of each of the alignment mark pads 433 is different from the pattern of each of the interconnecting pads 432. In particular, the pattern of each of the alignment mark pads 433 is in a cross shape, and the pattern of each of the interconnecting pads 432 is in a circular shape. The passivation layer 45 is transparent or translucent. Therefore, in a top view, even if each of the alignment mark pads 433 is covered by the passivation layer 45, an optical identification may still be operated.

Figure 11:
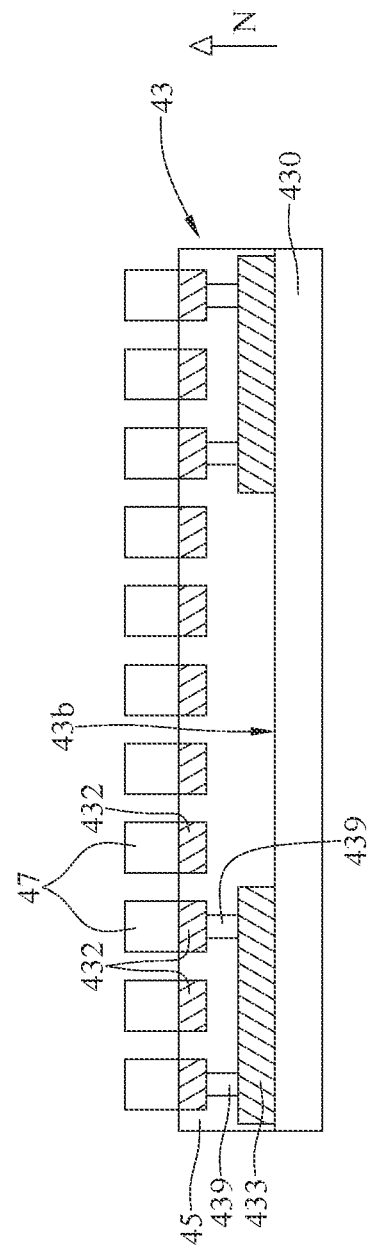
FIG. 11 illustrates a partial schematic cross-sectional view of an electronic device having alignment marks according to another embodiment of the disclosure.

Please refer to FIG. 11. FIG. 11 illustrates a partial schematic cross-sectional view of an electronic device having alignment marks according to another embodiment of the disclosure.

On the basis of the electronic device 4 as illustrated in FIG. 9 and FIG. 10, the alignment substrate 43 of the electronic device in this embodiment further includes a plurality of conductive traces 439. Each of the alignment mark pads 433 is electrically connected to some of the interconnecting pads 432 overlapped therewith through a plurality of conductive traces 439. In the embodiment, at least one of the alignment mark pads 433 is not electrically connected to the interconnecting pads 432 overlapped therewith.

Figure 12:
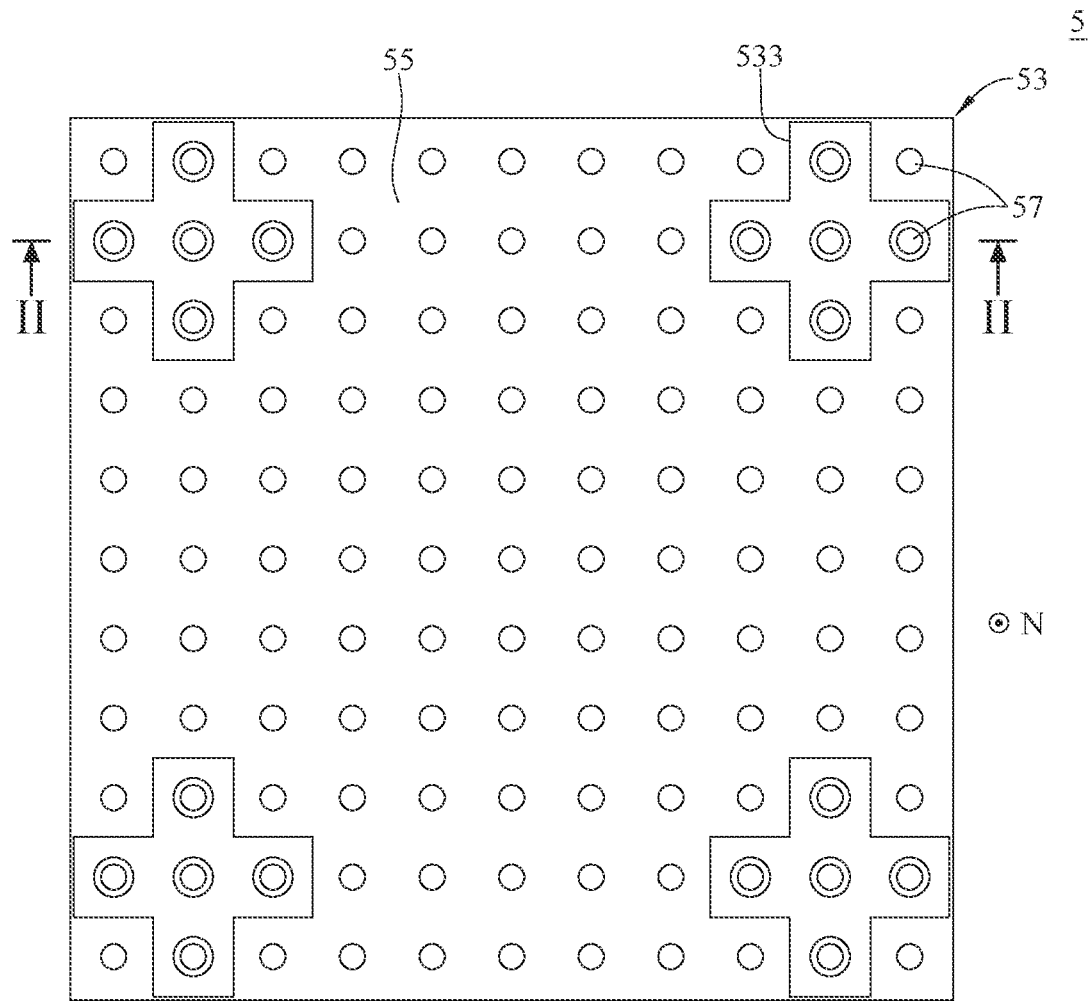
FIG. 12 illustrates a partial schematic top view of an electronic device having alignment marks according to another embodiment of the disclosure.
Figure 13:
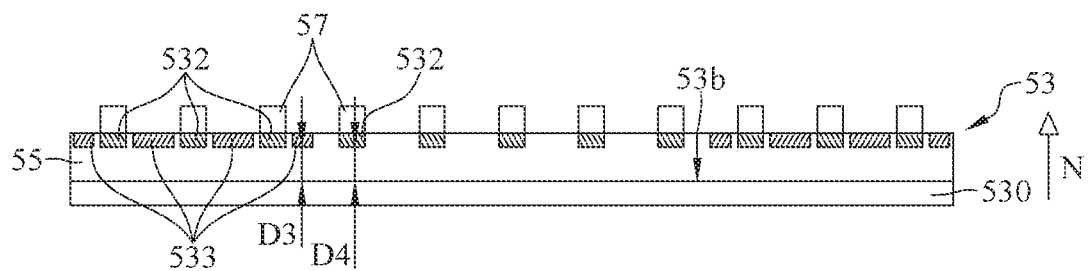
FIG. 13 illustrates a schematic cross-sectional view taken along a line II-II in FIG. 12.

Please refer to FIG. 12 and FIG. 13. FIG. 12 illustrates a partial schematic top view of an electronic device having alignment marks according to another embodiment of the disclosure. FIG. 13 illustrates a schematic cross-sectional view taken along a line II-II in FIG. 12.

In the embodiment, the electronic device 5 is similar to the electronic device 1 shown in FIG. 1 and FIG. 2, and a difference lies in an alignment substrate 53 and plurality of interconnecting bumps 57. Other details are omitted below.

In the embodiment, the alignment substrate 53 includes a core layer 530, a plurality of interconnecting pads 532, a plurality of alignment mark pads 533, and a passivation layer 55. The passivation layer 55 covers the core layer 530 and exposes the interconnecting pads 532 and the alignment mark pads 533. A distance D3 from each of the alignment mark pads 533 to the second surface 53b of the core layer 530 is substantially equal to a distance D4 from each of the interconnecting pads 532 to the second surface 53b. The interconnecting pads 532 and the alignment mark pads 533 are located at the same layer. The interconnecting bumps 57 are respectively disposed on the interconnecting pads 532.

The interconnecting pads 532 are greater in distribution density than the alignment mark pads 533. The alignment mark pads 533 are arranged in a square array. The interconnecting pads 532 are also arranged in a square array. One of the alignment mark pads 533 surround five of the interconnecting pads 532. The alignment mark pads 533 do not overlap with the interconnecting pads 532 along a normal line N of the second surface 53b. A pattern of each of the alignment mark pads 533 is larger in size than a pattern of each of the interconnecting pads 532. The pattern of each of the alignment mark pads 533 is different from the pattern of each of the interconnecting pads 532. In particular, the pattern of each of the alignment mark pads 533 is in a cross shape, and the pattern of each of the interconnecting pads 532 is in a circular shape.

Figure 14:
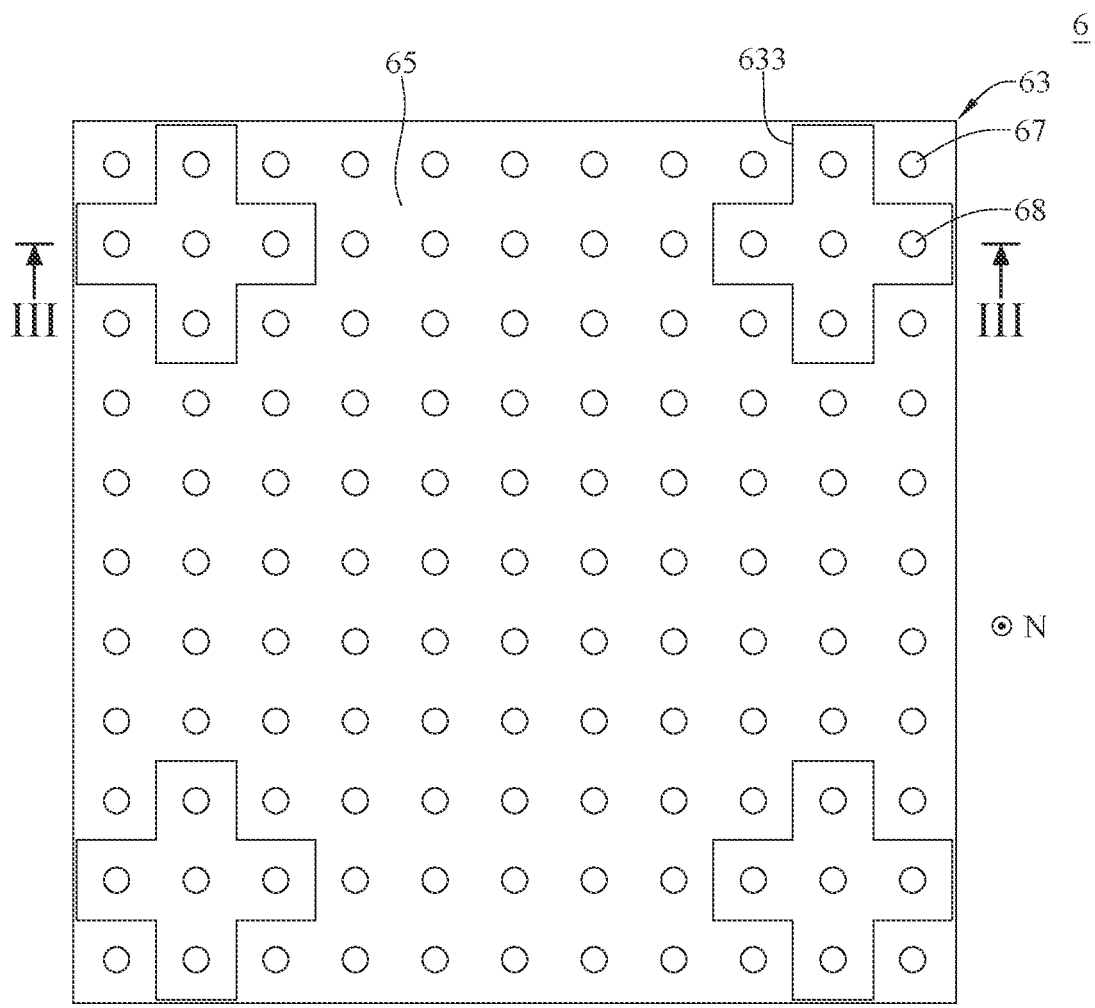
FIG. 14 illustrates a partial schematic top view of an electronic device having alignment marks according to another embodiment of the disclosure.
Figure 15:
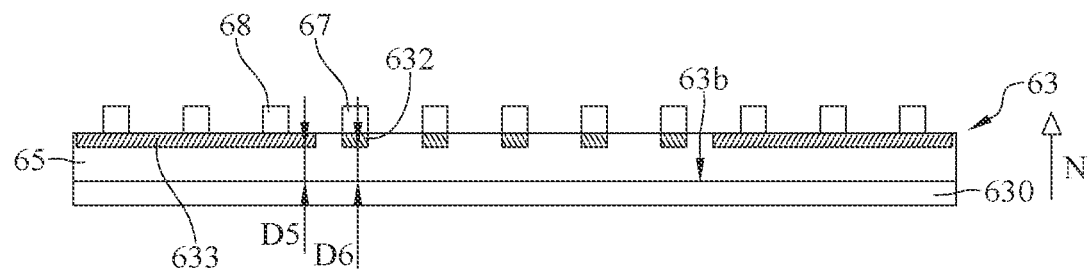
FIG. 15 illustrates a schematic cross-sectional view taken along a line III-III in FIG. 14.

Please refer to FIG. 14 and FIG. 15. FIG. 14 illustrates a partial schematic top view of an electronic device having alignment marks according to another embodiment of the disclosure. FIG. 15 illustrates a schematic cross-sectional view taken along a line III-III in FIG. 14.

In the embodiment, the electronic device 6 is similar to the electronic device 1 shown in FIG. 1 and FIG. 2, and a difference lies in an alignment substrate 63, a plurality of interconnecting bumps 67, and a plurality of alignment bumps 68. Other details are omitted below.

In the embodiment, the alignment substrate 63 includes a core layer 630, a plurality of interconnecting pads 632, a plurality of alignment mark pads 633, and a passivation layer 65. The passivation layer 65 covers the core layer 630 and exposes the interconnecting pads 632 and the alignment mark pads 633. A distance D5 from each of the alignment mark pads 633 to the second surface 63b of the core layer 630 is substantially equal to a distance D6 from each of the interconnecting pads 632 to the second surface 63b. The interconnecting pads 632 and the alignment mark pads 633 are located at the same layer. The interconnecting bumps 67 are respectively disposed on the interconnecting pads 632. Five of the alignment bumps 68 are disposed on one of the alignment mark pads 633.

The interconnecting pads 632 are greater in distribution density than the alignment mark pads 633. The alignment mark pads 633 are arranged in a square array. The interconnecting pads 632 are arranged in a square array at positions excluding the alignment mark pads 633. The interconnecting bumps 67 and the alignment bumps 68 are arranged together in a square array. The alignment mark pads 633 do not overlap with the interconnecting pads 632 along a normal line N of the second surface 63b. A pattern of each of the alignment mark pads 633 is larger in size than a pattern of five of the interconnecting pads 632. The pattern of each of the alignment mark pads 633 is different from a pattern of each of the interconnecting pads 632. In particular, the pattern of each of the alignment mark pads 633 is in a cross shape, and the pattern of each of the interconnecting pads 632 is in a circular shape.

Figure 16:
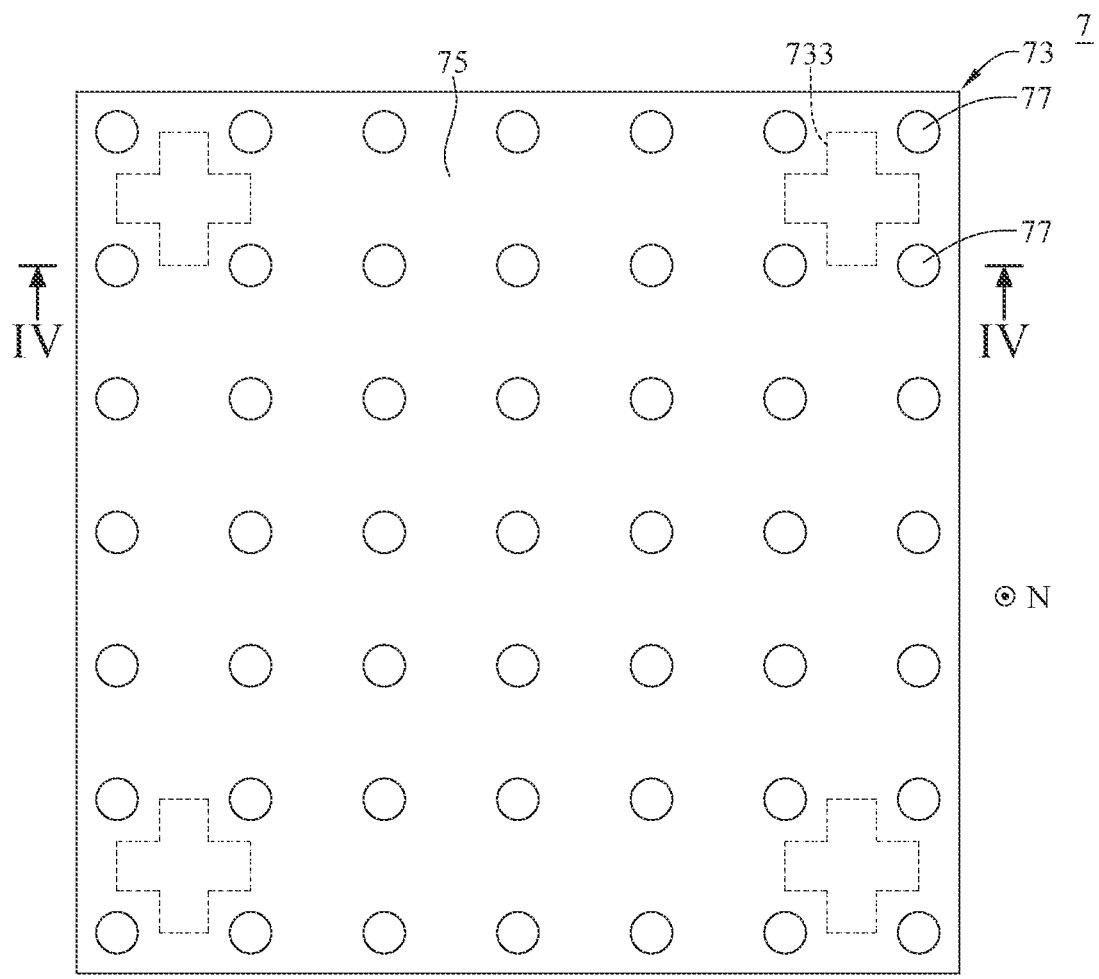
FIG. 16 illustrates a partial schematic top view of an electronic device having alignment marks according to another embodiment of the disclosure.
Figure 17:
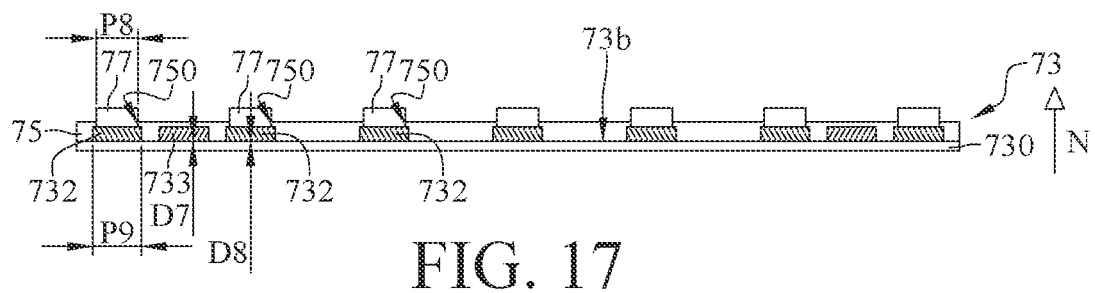
FIG. 17 illustrates a schematic cross-sectional view taken along a line IV-IV in FIG. 16.

Please refer to FIG. 16 and FIG. 17. FIG. 16 illustrates a partial schematic top view of an electronic device having alignment marks according to another embodiment of the disclosure. FIG. 17 illustrates a schematic cross-sectional view taken along a line IV-IV in FIG. 16.

In the embodiment, the electronic device 7 is similar to the electronic device 1 shown in FIG. 1 and FIG. 2, and a difference lies in an alignment substrate 73 and a plurality of interconnecting bumps 77. Other details are omitted below.

In the embodiment, the alignment substrate 73 includes a core layer 730, a plurality of interconnecting pads 732, a plurality of alignment mark pads 733 and a passivation layer 75. The passivation layer 75 covers the alignment mark pads 733 and the core layer 730 and has the openings 750. The openings 750 expose the interconnecting pads 732. A distance D7 from each of the alignment mark pads 733 to the second surface 73b of the core layer 730 is substantially equal to a distance D8 from each of the interconnecting pads 732 to the second surface 73b. The interconnecting pads 732 and the alignment mark pads 733 are located at the same layer.

The interconnecting bumps 77 are respectively disposed on the interconnecting pads 732. An orthogonal projection P8 of each of the interconnecting bumps 77 onto the second surface 73b is smaller than an orthogonal projection P9 of each of the interconnecting pads 732 onto the second surface 73b.

The interconnecting pads 732 are greater in distribution density than the alignment mark pads 733. The interconnecting pads 732 are arranged in a square array. The alignment mark pads 733 are also arranged in a square array. Each of the alignment mark pads 733 is located in a space among the interconnecting pads 732. The alignment mark pads 733 do not overlap with the interconnecting pads 732 along a normal line N of the second surface 73b. A pattern of each of the alignment mark pads 733 is different from a pattern of each of the interconnecting pads 732. In particular, the pattern of each of the alignment mark pads 733 is in a cross shape, and the pattern of each of the interconnecting pads 732 is in a circular shape. The passivation layer 75 is transparent or translucent. Therefore, in a top view, even if each of the alignment mark pads 733 is covered by the passivation layer 75, an optical identification may still be operated.

Figure 18:
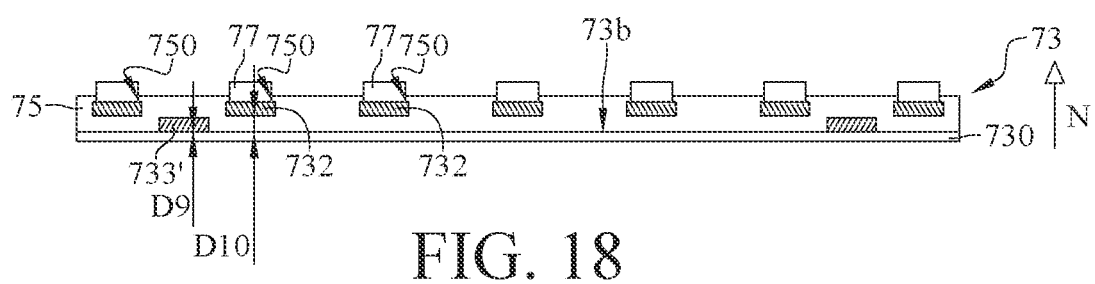
FIG. 18 illustrates a partial schematic cross-sectional view of an electronic device having alignment marks according to another embodiment of the disclosure.

Please refer to FIG. 18. FIG. 18 illustrates a partial schematic cross-sectional view of an electronic device having alignment marks according to another embodiment of the disclosure.

The electronic device in the embodiment is similar to the electronic device 7 shown in FIG. 16 and FIG. 17, and a difference lies in a plurality of interconnecting pads 732 and a plurality of alignment mark pads 733' of the alignment substrate 73. Other details are omitted below.

A distance D9 from each of the alignment mark pads 733 to the second surface 73b of the core layer 730 is smaller than a distance D10 from each of the interconnecting pads 732 to the second surface 73b. The interconnecting pads 732 and the alignment mark pads 733' are respectively located at different layers. The interconnecting pads 732 do not overlap with a plurality of (the alignment mark pads 733' along a normal line N of the second surface 73b. The passivation layer 75 is transparent or translucent. Therefore, in a top view, even if each of the alignment mark pads 733' is covered by the passivation layer 75, an optical identification may still be operated.

Figure 19:
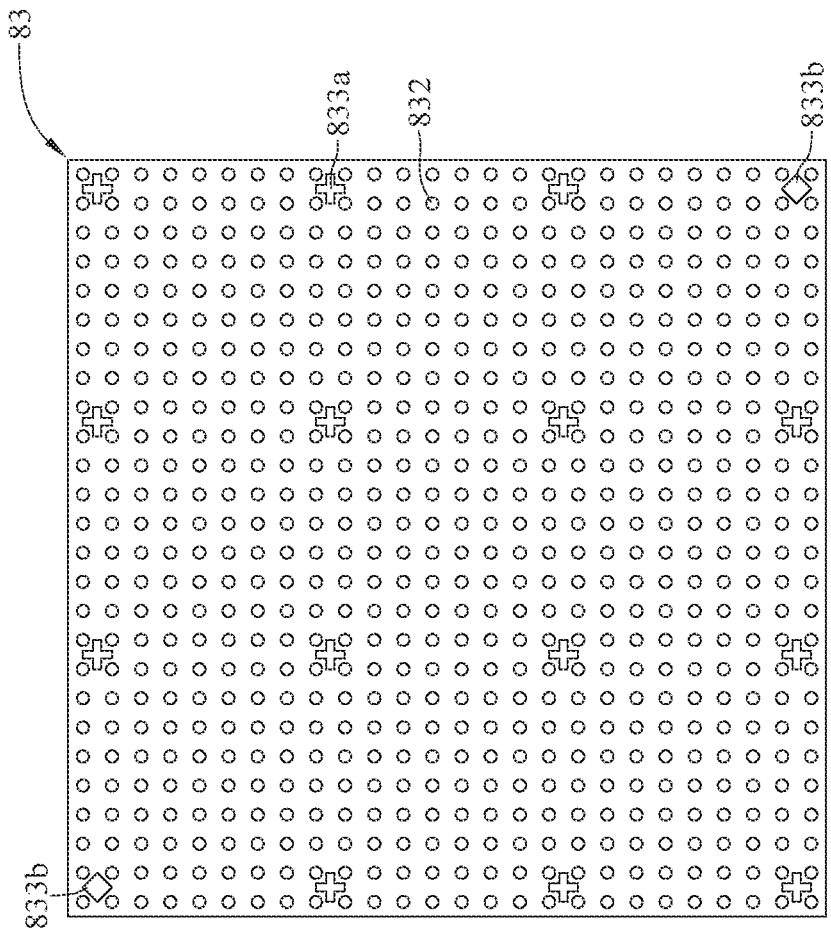
FIG. 19 illustrates a schematic top view of an alignment substrate of an electronic device having alignment marks according to another embodiment of the disclosure.

Please refer to FIG. 19. FIG. 19 illustrates a schematic top view of an alignment substrate of an electronic device having alignment marks according to another embodiment of the disclosure.

In the embodiment, the alignment substrate 83 includes a plurality of interconnecting pads 832, a plurality of first alignment mark pads 833a, and a plurality of second alignment mark pads 833b. A pattern of each of the first alignment mark pads 833a is different from a pattern of each of the second alignment mark pads 833b. The pattern of each of the first alignment mark pads 833a is different from a pattern of each of the interconnecting pads 832. The pattern of each of the second alignment mark pads 833b is different from the pattern of each of the interconnecting pads 832. In particular, the pattern of each of the first alignment mark pads 833a is in a cross shape, the pattern of each of the second alignment mark pads 833b is in a rhombus shape, and the pattern of each of the interconnecting pads 832 is in a circular shape.

The first alignment mark pads 833a are greater in distribution density than the second alignment mark pads 833b. The interconnecting pads 832 are greater in distribution density than the first alignment mark pads 833a, and greater in distribution density than the second alignment mark pads 833b.

The second alignment mark pads 833b are located in a upper left corner and a lower right corner in FIG. 19. The first alignment mark pads 833a are arranged in a square array at positions excluding the second alignment mark pads 833b. The interconnecting pads 832 are arranged in a square array at positions excluding the first alignment mark pads 833a and excluding the second alignment mark pads 833b.

Figure 20:
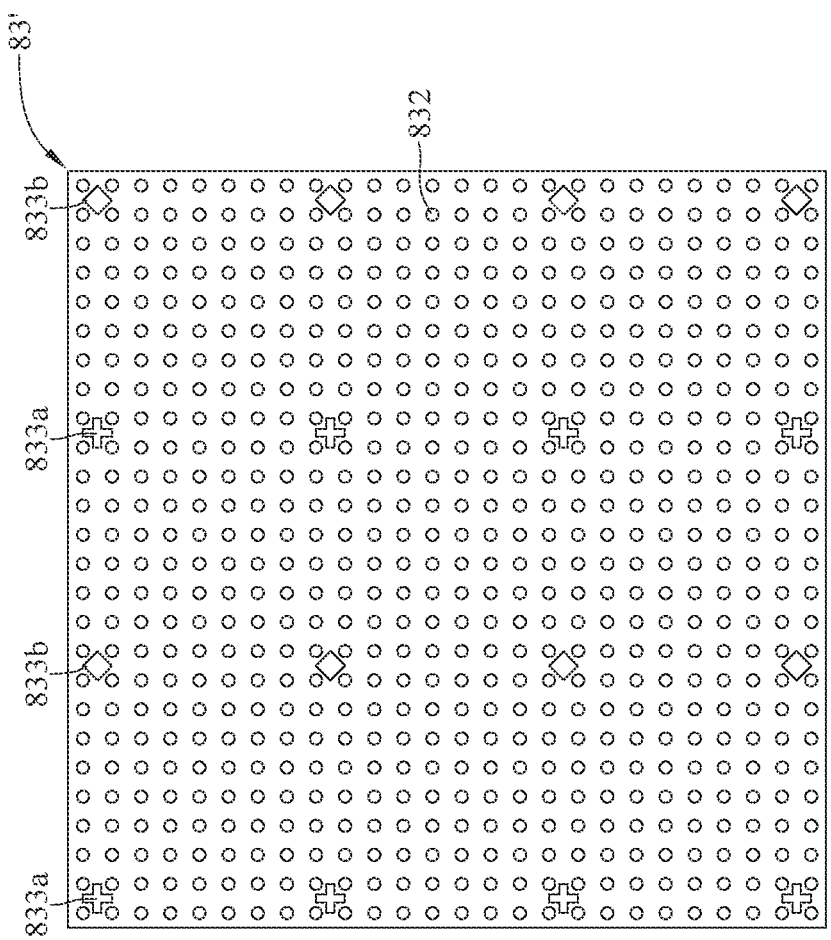
FIG. 20 illustrates a schematic top view of an alignment substrate of an electronic device having alignment marks according to another embodiment of the disclosure.

Please refer to FIG. 20. FIG. 20 illustrates a schematic top view of an alignment substrate of an electronic device having alignment marks according to another embodiment of the disclosure.

In the embodiment, the alignment substrate 83' is similar to the alignment substrate 83 shown in FIG. 19, and a difference lies in quantity and distribution of a plurality of interconnecting pads 832, a plurality of first alignment mark pads 833a, and a plurality of second alignment mark pads 833b. Other details are omitted below.

In the embodiment, the first alignment mark pads 833a are substantially equal in distribution density to the second alignment mark pads 833b. The interconnecting pads 832 are greater in distribution density than the first alignment mark pads 833a and greater in distribution density than the second alignment mark pads 833b.

The first alignment mark pads 833a are arranged in a rectangular array. The second alignment mark pads 833b are arranged in a rectangular array. The first alignment mark pads 833a and the second alignment mark pads 833b are staggered from each other. There is one column of the second alignment mark pads 833b sandwiched between adjacent two columns of the first alignment mark pads 833a. There is one column of the first alignment mark pads 833a sandwiched between adjacent two columns of the second alignment mark pads 833b. The interconnecting pads 832 are arranged in a square array at positions excluding the first alignment mark pads 833a and excluding the second alignment mark pads 833b.

Figure 21:
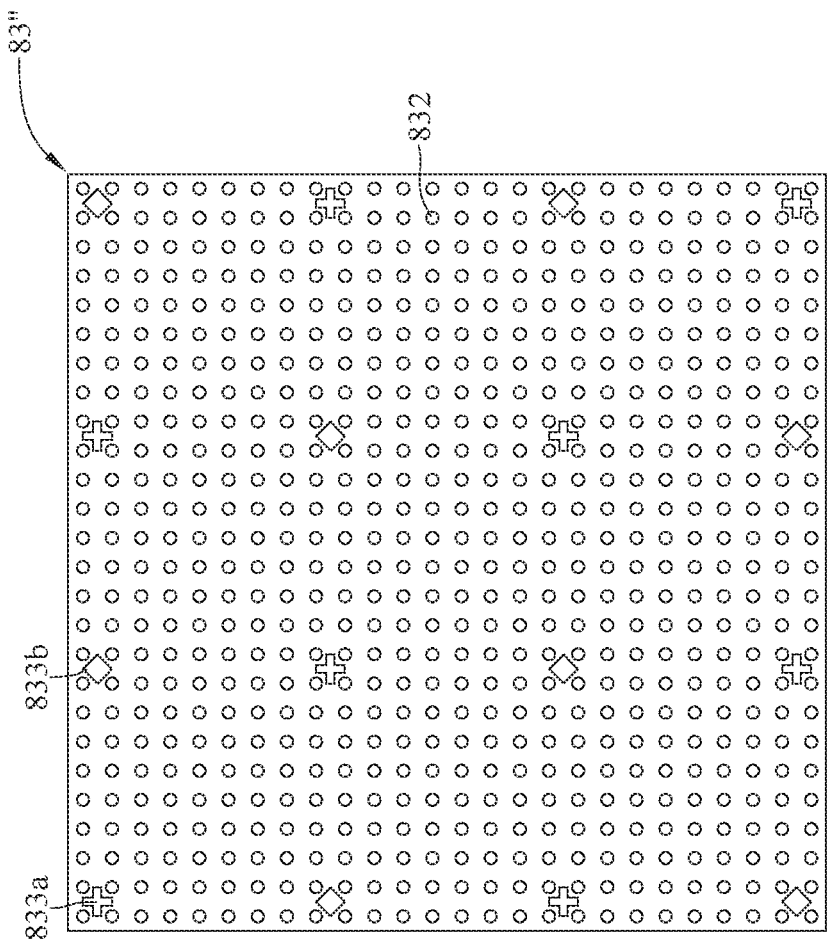
FIG. 21 illustrates a schematic top view of an alignment substrate of an electronic device having alignment marks according to another embodiment of the disclosure.

Please refer to FIG. 21. FIG. 21 illustrates a schematic top view of an alignment substrate of an electronic device having alignment marks according to another embodiment of the disclosure.

In the embodiment, the alignment substrate 83" is similar to the alignment substrate 83 shown in FIG. 19, and a difference lies in quantity and distribution of a plurality of interconnecting pads 832, a plurality of first alignment mark pads 833a, and a plurality of second alignment mark pads 833b. Other details are omitted below.

In the embodiment, the first alignment mark pads 833a are substantially equal in distribution density to the second alignment mark pads 833b. The interconnecting pads 832 are greater in distribution density than the first alignment mark pads 833a and greater in distribution density than the second alignment mark pads 833b.

The first alignment mark pads 833a are arranged in a rhombus array. The second alignment mark pads 833b are arranged in a rhombus array. The first alignment mark pads 833a and the second alignment mark pads 833b are staggered from each other. The first alignment mark pads 833a and the second alignment mark pads 833b are arranged together in a square array. There is one of the second alignment mark pads 833b sandwiched between adjacent two of the first alignment mark pads 833a. There is one of the first alignment mark pads 833a sandwiched between adjacent two of the second alignment mark pads 833b. The interconnecting pads 832 are arranged in a square array at positions excluding the first alignment mark pads 833a and excluding the second alignment mark pads 833b.

Figure 22:
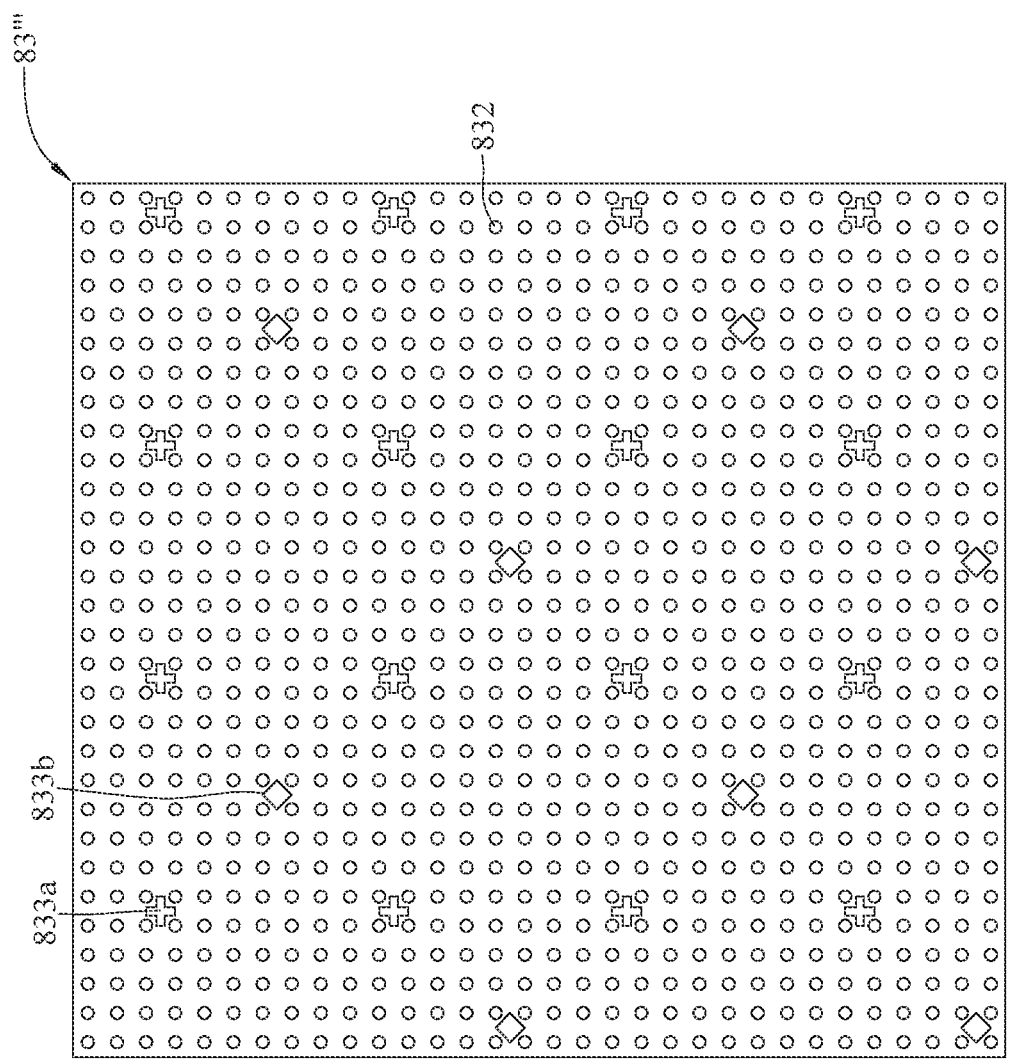
FIG. 22 illustrates a schematic top view of an alignment substrate of an electronic device having alignment marks according to another embodiment of the disclosure.

Please refer to FIG. 22. FIG. 22 illustrates a schematic top view of an alignment substrate of an electronic device having alignment marks according to another embodiment of the disclosure.

In the embodiment, the alignment substrate 83''' is similar to the alignment substrate 83 shown in FIG. 19, and a difference lies in quantity and distribution of a plurality of interconnecting pads 832, a plurality of first alignment mark pads 833a, and a plurality of second alignment mark pads 833b. Other details are omitted below.

In the embodiment, the first alignment mark pads 833a are greater in distribution density than the second alignment mark pads 833b. a plurality of interconnecting pads 832 are greater in distribution density than the first alignment mark pads 833a, and greater in distribution density than the second alignment mark pads 833b.

The first alignment mark pads 833a are arranged in a square array. The second alignment mark pads 833b are arranged in a rhombus array. The first alignment mark pads 833a and the second alignment mark pads 833b are staggered from each other. Six of the first alignment mark pads 833a are arranged in an adjacent-two-squares shape. There is one of the second alignment mark pads 833b disposed in a center of one square of the adjacent-two-squares shape. There are not any one of the second alignment mark pads 833b disposed in a center of another one square of the adjacent-two-squares shape. The interconnecting pads 832 are arranged in a square array at positions excluding the first alignment mark pads 833a and excluding the second alignment mark pads 833b.

Figure 23:
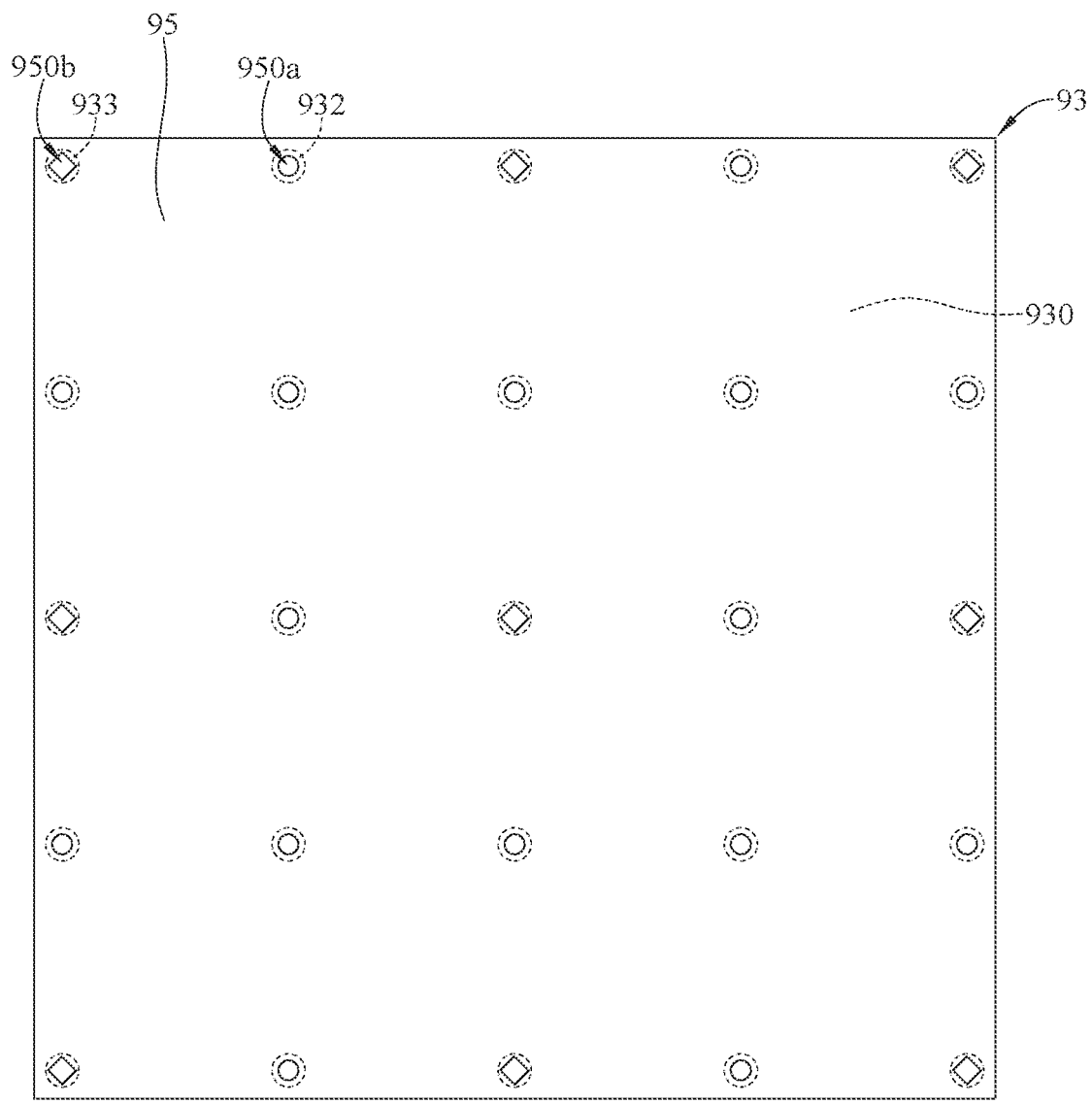
FIG. 23 illustrates a schematic top view of an alignment substrate of an electronic device having alignment marks according to another embodiment of the disclosure.

Please refer to FIG. 23. FIG. 23 illustrates a schematic top view of an alignment substrate of an electronic device having alignment marks according to another embodiment of the disclosure.

In the embodiment, the alignment substrate 93 includes a core layer 930, a plurality of interconnecting pads 932, a plurality of alignment mark pads 933, and a passivation layer 95. The interconnecting pads 932 and the alignment mark pads 933 are disposed on the core layer 930. The passivation layer 95 covers the core layer 930, the interconnecting pads 932 and the alignment mark pads 933. The passivation layer 95 is opaque, and has a plurality of first openings 950a and a plurality of second openings 950b. The interconnecting pads 932 are respectively partially exposed by the first openings 950a. The alignment mark pads 933 are respectively partially exposed by the second openings 950b. A pattern of each of the alignment mark pads 933 and a pattern of each of the interconnecting pads 932 are the same and both in a circular shape. A pattern of each of the first openings 950a may be different in size or shape from a pattern of each of the second openings 950b. In particular, the pattern of each of the first openings 950a is in a circular shape, and the pattern of each of the second openings 950b is in a rhombus shape.

According to the electronic device having alignment marks as discussed in the above embodiments of the disclosure, the first vias are greater in distribution density or quantity than the second vias, so that the second vias are disposed on the via-array substrate when the installation of most types of external electrical components to the alignment substrate and thereby enabling a part of the first vias to be electrically floating. Further, the arrangement of the alignment mark pads on the alignment substrate enables an easier installation of external electrical components onto the via-array substrate. Thus, the electronic devices as illustrated above are applicable for most type of external electrical components, so that the time and cost of developing and manufacturing substrates customized for different configurations of external electrical components are saved. Further, the alignment mark pads and the interconnecting pads may be formed together, thus there is no need to additionally form alignment marks using spraying or other means.

Although the disclosure is disclosed in the foregoing embodiments, it is not intended to limit the disclosure. All variations and modifications made without departing from the spirit and scope of the disclosure fall within the scope of the disclosure. For the scope defined by the disclosure, please refer to the attached claims.

What is claimed is:

1. An electronic device having alignment marks, comprising:
  a via-array substrate, having a plurality of first vias;
  an outer layer, having a plurality of second vias, wherein the outer layer is disposed on a side of the via-array substrate, and the plurality of first vias are greater in distribution density or quantity than the plurality of second vias, so that a part of the plurality of first vias is electrically connected to the plurality of second vias, and another part of the plurality of first vias is electrically floating; and
  an alignment substrate, comprising:
    a core layer, having a first surface and a second surface, wherein the core layer is disposed on the outer layer, and the first surface faces the outer layer;
    a plurality of conductive traces, disposed in the core layer;
    a plurality of interconnecting pads, disposed on the second surface of the core layer, wherein a part of the plurality of conductive traces electrically connects a part of the plurality of interconnecting pads and a part of the plurality of first vias; and
    a plurality of alignment mark pads, disposed on the second surface of the core layer; wherein
    a pattern of each of the plurality of alignment mark pads is different from a pattern of each of the plurality of interconnecting pads,
    a part of the plurality of conductive traces is electrically connected to the plurality of alignment mark pads.

2. The electronic device according to claim 1, further comprising at least one electronic element, wherein the at least one electronic element is disposed on the alignment substrate, the at least one electronic element comprises a plurality of marks and a plurality of conductive pads, the plurality of marks of the at least one electronic element are aligned with a part of the plurality of alignment mark pads, and the plurality of conductive pads are electrically connected to a part of the plurality of interconnecting pads.

3. The electronic device according to claim 2, wherein the plurality of alignment mark pads are greater in quantity than the plurality of marks of the at least one electronic element.

4. The electronic device according to claim 1, wherein the plurality of interconnecting pads are greater in distribution density than the plurality of alignment mark pads.

5. The electronic device according to claim 1, wherein the plurality of alignment mark pads and the plurality of interconnecting pads are in direct contact with the second surface.

6. The electronic device according to claim 1, wherein the alignment substrate further comprises a passivation layer, the passivation layer is transparent or translucent, the passivation layer covers the plurality of alignment mark pads and the core layer and has a plurality of openings, the plurality of openings expose the plurality of interconnecting pads, and a distance from the plurality of alignment mark pads to the second surface is smaller than a distance from the plurality of interconnecting pads to the second surface.

7. The electronic device according to claim 6, wherein the plurality of alignment mark pads overlap with a part of the plurality of interconnecting pads along a normal line of the second surface, and the pattern of each of the plurality of alignment mark pads is larger in size than the pattern of each of the plurality of interconnecting pads.

8. The electronic device according to claim 7, wherein each of the plurality of alignment mark pads is electrically connected to at least one of the plurality of interconnecting pads overlapping therewith.

9. The electronic device according to claim 6, wherein the plurality of alignment mark pads do not overlap with the plurality of interconnecting pads along a normal line of the second surface.

10. The electronic device according to claim 1, wherein the alignment substrate further comprises a passivation layer, the passivation layer covers the core layer and has a plurality of openings, and the plurality of openings expose the plurality of interconnecting pads and the plurality of alignment mark pads.

11. The electronic device according to claim 10, wherein the alignment substrate further comprises a plurality of interconnecting bumps and a plurality of alignment bumps, the plurality of interconnecting bumps are respectively disposed on the plurality of interconnecting pads, an orthogonal projection of each of the plurality of interconnecting bumps onto the second surface is smaller than or equal to an orthogonal projection of each of the plurality of interconnecting pads onto the second surface, the plurality of alignment bumps are respectively disposed on the plurality of alignment mark pads, and the orthogonal projection of each of the plurality of alignment bumps onto the second surface is smaller than or equals to the orthogonal projection of each of the plurality of alignment mark pads onto the second surface.

12. The electronic device according to claim 1, wherein the alignment substrate further comprises a passivation layer, the passivation layer is transparent or translucent, the passivation layer covers the core layer and the plurality of alignment mark pads and has a plurality of openings, the plurality of openings expose the plurality of interconnecting pads, and a distance from the plurality of alignment mark pads to the second surface substantially equals to a distance from the plurality of interconnecting pads to the second surface.

13. The electronic device according to claim 12, wherein the alignment substrate further comprises a plurality of interconnecting bumps, the plurality of interconnecting bumps are respectively disposed on the plurality of interconnecting pads, and an orthogonal projection of each of the plurality of interconnecting bumps onto the second surface is smaller than or equal to an orthogonal projection of each of the plurality of interconnecting pads onto the second surface.

14. The electronic device according to claim 1, wherein the pattern of each of the plurality of alignment mark pads and the pattern of each of the plurality of interconnecting pads are different in size, shape, or color.

15. The electronic device according to claim 1, wherein the plurality of alignment mark pads comprises a plurality of first alignment mark pads and a plurality of second alignment mark pads, a pattern of each of the plurality of first alignment mark pads is different from a pattern of each of the plurality of second alignment mark pads, the pattern of each of the plurality of first alignment mark pads is different from the pattern of each of the plurality of interconnecting pads, and the pattern of each of the plurality of second alignment mark pads is different from the pattern of each of the plurality of interconnecting pads.

16. The electronic device according to claim 1, wherein at least one of the plurality of conductive traces is electrically connected to at least one of the plurality of second vias.

17. The electronic device according to claim 16, further comprising a switchable circuit chip, wherein the switchable circuit chip is electrically connected to at least one of the plurality of first vias, a part of the plurality of conductive traces of the alignment substrate is electrically connected to the switchable circuit chip, and the switchable circuit chip is configured for controlling an electrical connection between a part of the plurality of interconnecting pads and at least one of the plurality of first vias.

18. The electronic device according to claim 17, further comprising at least one electronic element, wherein the at least one electronic element is disposed on the alignment substrate, the at least one electronic element is electrically connected to at least one of the plurality of first vias through a part of the plurality of interconnecting pads, a part of the plurality of conductive traces, and the switchable circuit chip.

19. The electronic device according to claim 1, further comprising a plurality of external contacts, wherein the plurality of external contacts are disposed on a surface of the via-array substrate located away from the alignment substrate and electrically connected to the plurality of first vias.

20. An electronic device having alignment marks, comprising:
a via-array substrate, having a plurality of first vias;
an outer layer, having a plurality of second vias, wherein the outer layer is disposed on a side of the via-array substrate, and the plurality of first vias are greater in distribution density or quantity than the plurality of second vias, so that a part of the plurality of first vias is electrically connected to the plurality of second vias, and another part of the plurality of first vias is electrically floating; and an alignment substrate, comprising:
- a core layer, having a first surface and a second surface, wherein the core layer be disposed on the outer layer, and the first surface faces the outer layer;
- a plurality of conductive traces, disposed in the core layer;
- a plurality of interconnecting pads, disposed on the second surface of the core layer, wherein a part of the plurality of conductive traces electrically connects a part of the plurality of interconnecting pads and a part of the plurality of first vias;
- a plurality of alignment mark pads, disposed on the second surface of the core layer; and
- a passivation layer, covering the core layer and having a plurality of first openings and a plurality of second openings, wherein the passivation layer is opaque, the plurality of interconnecting pads are respectively partially exposed by the plurality of first openings, the plurality of alignment mark pads are respectively partially exposed by the plurality of second openings, and a pattern of each of the plurality of first openings is different in size or shape from a pattern of each of the plurality of second openings,
- wherein a part of the plurality of conductive traces is electrically connected to the plurality of alignment mark pads.

* * * * *